US009551508B2

(12) United States Patent
Straeter

(10) Patent No.: US 9,551,508 B2
(45) Date of Patent: Jan. 24, 2017

(54) GROUND MOUNTED SOLAR POWER ASSEMBLY

(71) Applicant: James E. Straeter, Rochester, IN (US)

(72) Inventor: James E. Straeter, Rochester, IN (US)

( * ) Notice: Subject to any disclaimer, the term of this patent is extended or adjusted under 35 U.S.C. 154(b) by 0 days.

(21) Appl. No.: 13/924,966

(22) Filed: Jun. 24, 2013

(65) Prior Publication Data

US 2014/0374550 A1    Dec. 25, 2014

(51) Int. Cl.
| | | |
|---|---|---|
| *F16L 3/00* | (2006.01) | |
| *F24J 2/52* | (2006.01) | |
| *F24J 2/54* | (2006.01) | |
| F16M 11/00 | (2006.01) | |
| F16M 11/32 | (2006.01) | |
| F16L 21/02 | (2006.01) | |
| F16L 23/00 | (2006.01) | |
| E04H 12/00 | (2006.01) | |
| F16M 11/10 | (2006.01) | |
| F16M 13/00 | (2006.01) | |
| F16M 11/20 | (2006.01) | |
| H01L 31/042 | (2014.01) | |

(52) U.S. Cl.
CPC ............ *F24J 2/523* (2013.01); *F24J 2/5264* (2013.01); *F24J 2/541* (2013.01); *F16M 11/00* (2013.01); *F16M 11/10* (2013.01); *F16M 11/2021* (2013.01); *F16M 13/00* (2013.01); *F16M 2200/027* (2013.01); *F24J 2002/5298* (2013.01); *H01L 31/042* (2013.01); *Y02B 10/12* (2013.01); *Y02B 10/20* (2013.01); *Y02E 10/47* (2013.01); *Y02E 10/50* (2013.01)

(58) Field of Classification Search
CPC ........ F16M 11/32; F16M 13/00; F16M 11/10; F16M 11/2021; F16M 2200/027; F16M 11/00;A47B 3/02; A47B 13/02; B25H 1/04; B25H 1/06; A47C 9/105; H01L 31/0422; H01L 31/042; Y02B 10/12; Y02B 10/20; Y02E 10/50; Y02E 10/47
USPC ............ 248/163.1, 164, 166, 169, 170, 173, 248/440.1, 176.1, 121; 285/365; 52/655.1
See application file for complete search history.

(56) References Cited

U.S. PATENT DOCUMENTS

| | | | | |
|---|---|---|---|---|
| 295,269 | A * | 3/1884 | Miller ............................ | 182/153 |
| 2,113,540 | A * | 4/1938 | Maddock ...................... | 280/794 |
| 2,381,647 | A * | 8/1945 | Cibulka ..................... | 52/651.05 |
| 3,087,701 | A * | 4/1963 | Wallace ........................ | 248/166 |
| 4,108,154 | A * | 8/1978 | Nelson .......................... | 126/576 |
| 4,314,434 | A * | 2/1982 | Meisberger ................ | 52/651.02 |
| 4,417,376 | A * | 11/1983 | Kammeraad et al. ........ | 29/26 A |
| 4,596,484 | A * | 6/1986 | Nakatani ....................... | 403/104 |
| 4,995,377 | A * | 2/1991 | Eiden ............................ | 126/605 |
| 5,228,924 | A * | 7/1993 | Barker et al. ................. | 136/246 |
| 5,305,114 | A * | 4/1994 | Egashira et al. .............. | 358/401 |
| 6,923,416 | B1 * | 8/2005 | Hsieh ............................ | 248/431 |
| 7,374,137 | B2 * | 5/2008 | Staney ....................... | 248/122.1 |

(Continued)

FOREIGN PATENT DOCUMENTS

CA    2761088 A1 *   11/2010    ........... H01L 31/042

*Primary Examiner* — Brian Mattei
*Assistant Examiner* — Taylor Morris
(74) *Attorney, Agent, or Firm* — Zarley Law Firm, P.L.C.

(57) ABSTRACT

A ground mounted solar power assembly having at least one solar panel having a support beam connected to the back of the solar panel. A plurality of legs have a bracket at one end that receive the support beam. Finally, an eccentric handle is connected to the bracket to permit selective rotation of the support beam within the bracket.

13 Claims, 3 Drawing Sheets

(56) References Cited

U.S. PATENT DOCUMENTS

| | | |
|---|---|---|
| 2005/0199769 A1* | 9/2005 | Rudder et al. ............. 248/218.4 |
| 2008/0191545 A1* | 8/2008 | Laird ......................... 301/124.1 |
| 2009/0095283 A1* | 4/2009 | Curtis et al. ................. 126/704 |
| 2009/0188487 A1* | 7/2009 | Jones et al. .................. 126/600 |
| 2010/0089389 A1* | 4/2010 | Seery et al. .................. 126/608 |
| 2011/0163541 A1* | 7/2011 | Bronnert ....................... 285/365 |
| 2011/0289750 A1* | 12/2011 | Kats et al. ..................... 29/428 |
| 2012/0131877 A1* | 5/2012 | Fang et al. ................. 52/651.09 |
| 2012/0216851 A1* | 8/2012 | Jang ............................. 136/246 |

* cited by examiner

GROUND MOUNTED SOLAR POWER ASSEMBLY

BACKGROUND OF THE INVENTION

This invention is directed to a solar power assembly and more particularly to a stand for a solar power assembly that permits efficient use of solar power over a wider range of ground conditions.

Solar power assemblies are known in the art. Typically solar panel assemblies are mounted on top of a building. While there exist ground mounted solar power assemblies to keep the panels cooler, they are expensive to install and limited to certain ground conditions. Not only can soft ground prevent accessibility of cement trucks, but the holes for the heavy support members or legs create excessive spoil dirt and require a substantial amount of concrete.

In addition, it is desirable to maintain the solar panels as close to perpendicular to the light rays as possible. While trackers are used to maintain an optimum position of the panels, the trackers are expensive and prone to mechanical wear and breakage. Thus, there exists a need in the art for a solar power assembly that addresses these discrepancies.

An objective of the present invention is to provide a solar power assembly that is more efficient to operate.

A further objective of the present invention is to provide a solar power assembly that is easier and less expensive to install.

A further objective of the present invention is to provide a stand for a solar array that is less expensive to manufacture with no loss of strength to withstand wind forces.

A further objective of the present invention is to provide an easy mechanical adjustment of array angle.

These and other objectives will be apparent to one of ordinary skill in the art based upon the following written description, drawings, and claims.

SUMMARY OF THE INVENTION

A ground mounted solar power assembly having at least one solar panel having a support beam connected to the back of the solar panel. A plurality of legs have a bracket at one end that receive the support beam. Finally, an eccentric handle is connected to the bracket to permit selective rotation of the support beam within the bracket and a mechanical adjustment of array angle.

DETAILED DESCRIPTION OF THE PREFERRED EMBODIMENTS

Figure 1:
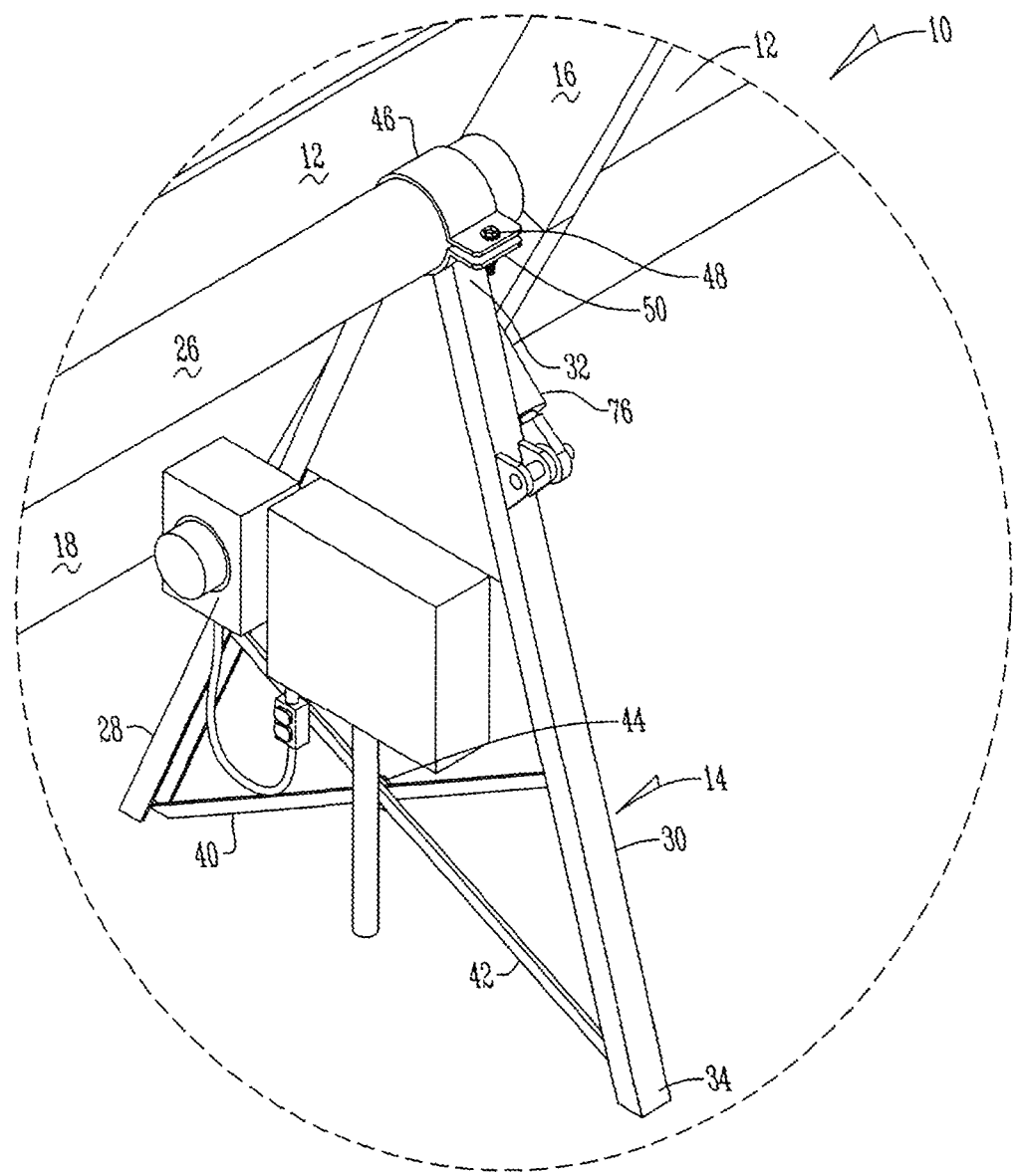
FIG. 1 is a perspective view of a solar power assembly.
Figure 2:
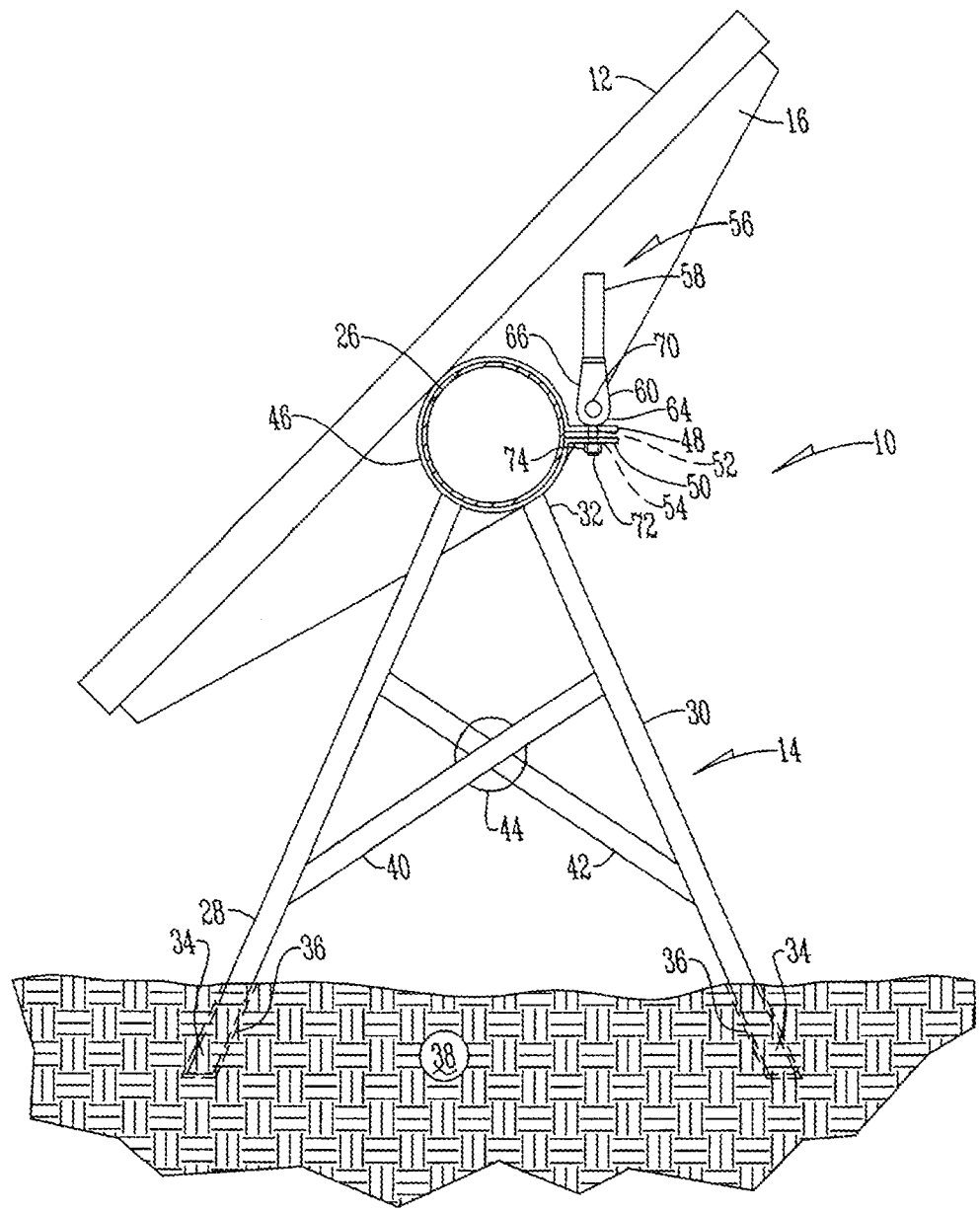
FIG. 2 is a side sectional view of a solar power assembly.

Referring to the Figures, the solar panel assembly 10 has one or more solar arrays 12 that are pivotally connected to a plurality of legs 14.

A conventional solar array 12 has a plurality of ribs 16 that extend transversely across the back of the array 12 from a first edge to a second edge 18. Centrally located and extending through the ribs 16 from a first end of the array 12 to a second end of the array 12 is a support beam 26. The support beam 26 is rotatably connected to the legs 14.

The ribs have cross members welded to them in order to accept bolts to hold the adjacent solar panels. By welding short brackets on the ribs one rib can provide support for the ends of two panels, essentially providing for one rib for each column of panels rather than having two ribs for each panel or needing a cross member extending the entire length of the array to provide an intermediate structural member to connect the panels to the ribs.

The legs 14 are of any size and shape and preferably have a first leg member 28 and a second leg member 30 that are spaced apart and angle toward one another from a first end 32 to a second end 34 to generally form an A-shape creating a triangular leg design. The first ends 32 of the legs 14 are received in holes 36 in the ground 38. Preferably the holes 36 are approximately nine inches in diameter and approximately sixty inches deep so that the holes 36 may be set by manually filling the holes with bagged cement.

Connected to and extending between leg member 28 and 30 are a pair of brace member 40 and 42 that intersect to form an X-shape. At the point of intersection the brace members 40 and 42 are connected to a support plate 44 that is preferably round. Preferred is that the brace members 40 and 42 are made of channel steel which reduces the weight of the legs while, in combination with the support plate 44, maintain the structural strength of the leg to keep a 90 mile wind load rating intact while using a minimal amount of steel.

The second end 34 of leg members 28 and 30 are connected to, preferably by welds, a circular bracket 46. Bracket 46 is formed to fit around support beam 26 and terminate in an upper 48 and lower 50 outwardly extending flange. The upper and lower flanges 48 and 50 have generally centrally located openings 52 and 54 that are vertically aligned with one another.

Connected to bracket 36 is an eccentric handle 56. The handle 56 has a gripping member 58 that is connected to a pair of spaced apart cam plates 60 and 62 having an end surface 64 and a side surface 66 that engage the upper flange 48. Both plates 60 and 62 have aligned openings 68 that receive a cylinder 70. The cylinder 70 is connected to a bolt 72 that extends through openings 52 and 54 where the bolt 72 threadably receives a nut 74.

Figure 3:
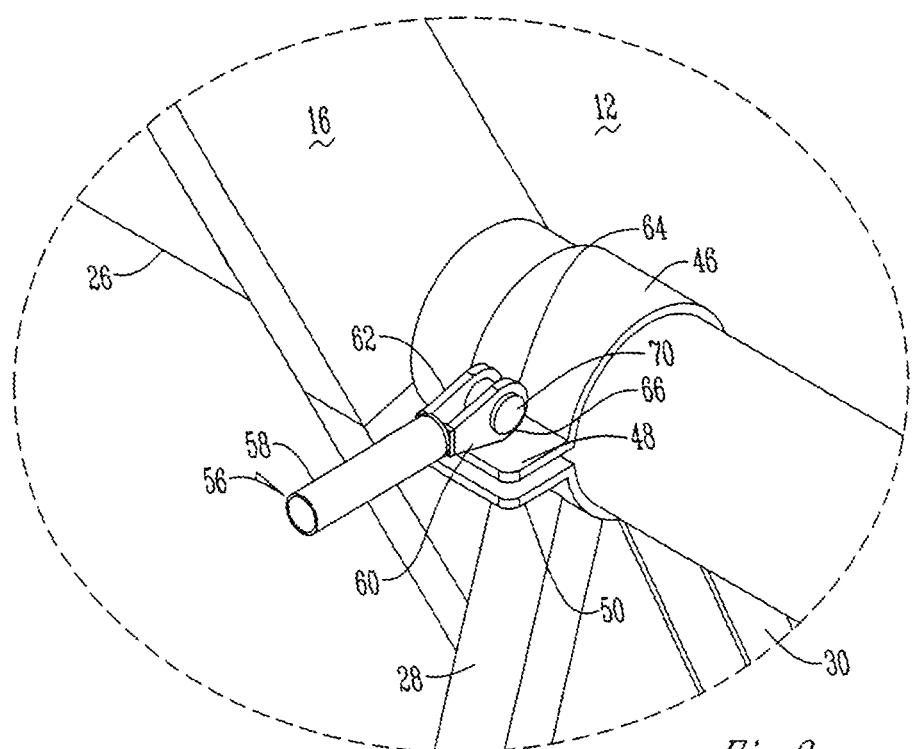
FIG. 3 is a partial perspective view of a solar power assembly.

In operation, the arrays 12 are locked when the handle 56 is rotated to a closed or lowered position as shown in FIG. 3. Because the space between the side surface 66 and opening 68 is greater than the distance between the end surface 64 and the opening 68, the cylinder 70 and bolt 72 are raised and separated from the upper flange 48 while side surface 66 of the cam plates 60 and 62 and the nut 74 push flanges 48 and 50 together. As flanges 48 and 50 are pushed together, bracket 46 clamps down upon support beam 26 to hold and lock the array 12 in position as it relates to the leg 14.

Figure 4:
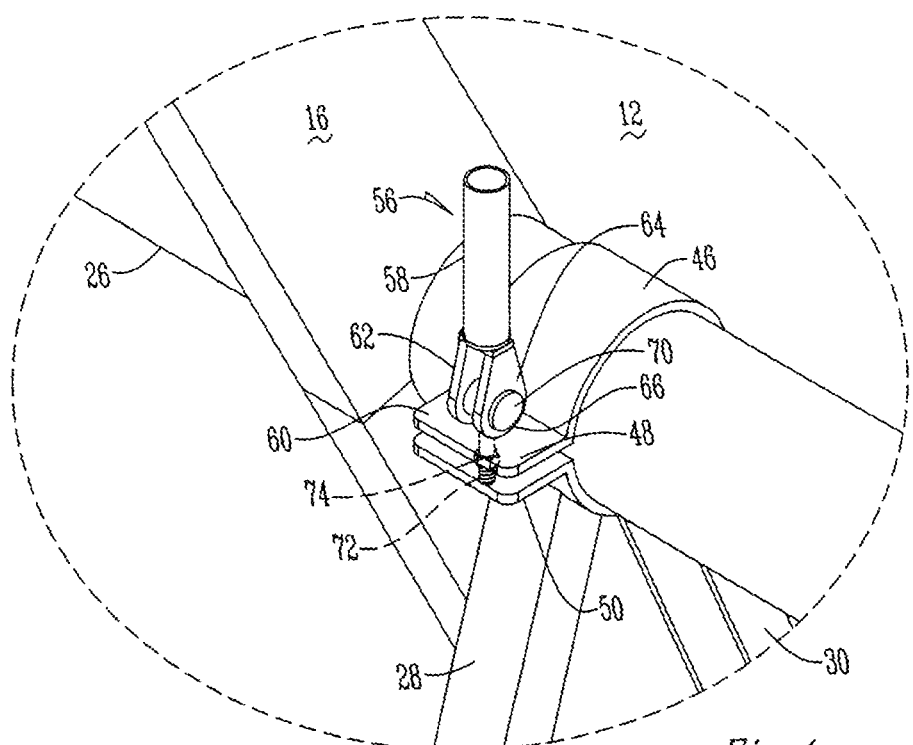
FIG. 4 is a partial perspective view of solar power assembly.

To change the position of the panel 12, the handle 56 is rotated to a second or open position as shown in FIG. 4. In this second position, due to the reduced space between the end surface 64 and opening 68, the cylinder 70 and bolt 72 are lowered in relation to the upper flange 48 which in turn lowers nut 74 and permits lower flange 50 to separate from upper flange 48. As the upper and lower flange 48 and 50 separate, bracket 46 releases frictional pressure upon support beam 26 which permits support beam 26 to rotate in relation to the legs.

To assist in repositioning the array 12, an adjustment member 76 such as a turnbuckle is used. Preferably, the adjustment member 76 is connected to a leg 14 at one end and the array 12 at the opposite end. Once the array 12 is moved to a new desired position, the handle 56 is moved to its first or closed position such that bracket 46 exerts frictional locking force upon support beam 26.

What is claimed is:

1. A ground mounted solar power assembly, comprising;
   at least one solar panel having a support beam connected to the back of the solar panel;
   a plurality of legs are connected at a first end, and a bracket welded to the first end of the legs that releasably receives the support beam; and
   an eccentric handle connected to the bracket and having a pair of cam plates with aligned openings, a pair of side surfaces, and an end surface that engages an upper flange of the bracket to permit selective rotation of the support beam within the bracket;
   wherein the space between the openings in the cam plate and the pair of side surfaces is greater than the space between the opening in the cam plate and the end surface.

2. The assembly of claim 1 wherein the legs have a first leg member and a second leg member that are spaced apart and angle toward one another from a first end to a second end to generally form a triangular shape.

3. The assembly of claim 2 wherein a pair of brace members are connected to and extend between the first leg member and the second leg member in an intersecting manner to form an X-shape.

4. The assembly of claim 3 wherein a support plate is connected to the pair of braces at a point of intersection.

5. The assembly of claim 1 wherein the bracket is circular and formed to fit around the support beam.

6. The assembly of claim 5 wherein the bracket terminates in an upper and a lower outwardly extending flange.

7. The assembly of claim 1 wherein a turnbuckle is connected to a support rib and a leg member to maintain a desired angle of the panels to the sun.

8. A ground mounted solar assembly, comprising:
   at least one leg having a first leg member and a second leg member;
   a circular bracket connected to the at least one leg, wherein the circular bracket has a continuous uniform body and an opening;
   a handle connected to the circular bracket and having a pair of spaced-apart cam plates with an end surface that engages an upper flange of the bracket;
   a cylinder received within aligned openings in the pair of cam plates and connected to a bolt;
   a support beam rotatably received within the opening of the circular bracket;
   at least one solar array connected to the support beam;
   wherein when the handle is in an open position, the circular bracket releases frictional pressure upon the support beam permitting rotation of the support beam and the connected solar array in relation to the at least one leg.

9. The assembly of claim 8 wherein when the handle is in, a closed position, the circular bracket clamps down upon the support beam locking the support beam and the connected solar array in position in relation to the at least one leg.

10. The assembly of claim 8 wherein the handle has a gripping member.

11. The assembly of claim 8 further comprising the bolt extending through an opening in the upper flange and an opening in a lower flange of the bracket.

12. The assembly of claim 3 wherein the brace members are made of channel steel.

13. A ground mounted solar power assembly, comprising;
    at least one solar panel having a support beam connected to the back of the solar panel;
    a plurality of legs having a bracket at one end of that releasably receives the support beam;
    an eccentric handle connected to each bracket having a pair of spaced cam plates having aligned openings to permit selective rotation of the support beam within the bracket; and
    the pair of cams each having a pair of side surfaces and an end surface, wherein the space between the openings in the cam plate and the pair of side surfaces is greater than the space between the opening in the cam plate and the end surface.

* * * * *